United States Patent
Salib

(10) Patent No.: US 6,993,312 B1
(45) Date of Patent: Jan. 31, 2006

(54) DOUBLE BALANCED DIODE MIXER WITH HIGH OUTPUT THIRD ORDER INTERCEPT POINT

(75) Inventor: Mike L. Salib, Millersville, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/855,391

(22) Filed: May 28, 2004

Related U.S. Application Data

(63) Continuation-in-part of application No. 10/058,279, filed on Jan. 30, 2002, now Pat. No. 6,810,241.

(51) Int. Cl.
*H04B 1/26* (2006.01)
(52) U.S. Cl. ............... 455/326; 455/323; 455/327; 455/328; 455/330
(58) Field of Classification Search ........ 455/318–333, 455/302–306, 313, 292, 296, 341, 280, 293, 455/284, 334; 327/355–356, 113, 361, 118, 327/114–117, 119–127; 333/119, 177, 24 R, 333/26
See application file for complete search history.

(56) References Cited

U.S. PATENT DOCUMENTS

| | | | |
|---|---|---|---|
| 4,219,779 A | | 8/1980 | Shinkawa et al. |
| 5,003,622 A | * | 3/1991 | Ma et al. .................. 455/327 |
| 5,034,994 A | * | 7/1991 | Muterspaugh et al. ...... 455/326 |
| 5,060,298 A | * | 10/1991 | Waugh et al. .............. 455/326 |
| 5,280,648 A | * | 1/1994 | Dobrovolny ................ 455/326 |
| 5,381,084 A | * | 1/1995 | Joshi et al. ................. 323/361 |
| 5,434,546 A | * | 7/1995 | Palmer ...................... 332/151 |
| 5,678,225 A | * | 10/1997 | Kobayashi .................. 455/330 |
| 5,740,528 A | * | 4/1998 | Drennen .................... 455/327 |
| 5,742,897 A | * | 4/1998 | Plowdrey et al. ........... 455/142 |
| 5,752,181 A | | 5/1998 | Vice |
| 5,790,945 A | | 8/1998 | Erickson |
| 5,854,974 A | | 12/1998 | Li |
| 6,252,469 B1 | | 6/2001 | Suematsu |
| 6,871,059 B1 | * | 3/2005 | Piro et al. .................. 455/333 |

* cited by examiner

*Primary Examiner*—Pablo N. Tran
(74) *Attorney, Agent, or Firm*—Birch, Stewart, Kolasch & Birch, LLP

(57) ABSTRACT

A double balanced mixer consisting of an RF balun, a local oscillator balun and a diode "quad" bridge circuit connected between the two baluns and where the IF output is taken at the center tap of the RF balun secondary transformer. A second harmonic termination consisting of an RLC resonant circuit is coupled across the diode bridge at the RF side. Each arm of the diode bridge, moreover, includes three series connected diodes. The mixer is in the form of a microminiature integrated circuit (MMIC) using HBT emitter-based junction diodes fabricated on a gallium arsenide (GaAs) substrate.

12 Claims, 3 Drawing Sheets

DOUBLE BALANCED DIODE MIXER WITH HIGH OUTPUT THIRD ORDER INTERCEPT POINT

CROSS REFERENCE TO RELATED APPLICATION

This application is a continuation-in-part of U.S. Ser. No. 10,058,279, which was filed on Jan. 30, 2002, now U.S. Pat No. 6,810,241.

BACKGROUND OF THE INVENTION

1. Field of the Invention

This invention relates generally to electrical signal mixers wherein two or more signals are combined to provide an output signal which is translated upward or downward in frequency and, more particularly, to a monolithic RF L-band double balanced diode mixer having a high output third order intercept point.

2. Description of Related Art

The output third order intercept point of an RF signal mixer provides a measure of its linearity. When two signals that are very close in frequency propagate through a mixer of high linearity, the inter-modulation product 2f1–f2 of frequencies f1 and f2 and 2f2–f1 that get generated are low in magnitude where f1 and f2 are two tones that are relatively close in frequency. Such a feature is extremely important because it provides a radar system, for example, with a larger dynamic range and the ability to detect weaker targets.

SUMMARY

It is an object of the present invention to provide a double balanced mixer which has an output third order intercept point (OIP3) that is higher than that achieved with conventional state of the art signal mixers.

This and other objects are achieved by a double balanced mixer comprised of an RF balun, a local oscillator balun and a diode bridge connected between the two baluns and where the IF output is taken at the center tap of the RF balun secondary transformer. A harmonic termination consisting of an RLC resonant circuit is coupled across the RF side of the diode bridge. Each arm of the diode bridge, moreover, includes three series connected diodes. The mixer is in the form of a microminiature integrated circuit (MMIC) fabricated using heterojunction bipolar transistor (HBT) emitter-based junction diodes on a gallium arsenide (GaAs) substrate.

In one aspect of the subject invention, a double balanced diode mixer is disclosed which includes: a first and second balun type transformer, each having interwound pairs of series connected primary and secondary windings; a radio frequency (RF) input port connected to one end of the pair of primary windings of the first transformer; a local oscillator (LO) input port connected to one end of the primary winding of the second transformer; an intermediate frequency (IF) output port coupled to a center tap between the secondary windings of the first transformer; a four arm diode bridge circuit including pairs of opposing bridge terminals and wherein each arm includes a plurality of series connected diodes, typically three diodes, with the secondary windings of the first transformer being connected across one pair of bridge terminals and secondary windings of the second transformer being connected to the other pair of bridge terminals; and, a resonant circuit consisting of a series connected resistor capacitor and inductor connected across the bridge at the RF side of the mixer, and more particularly, across the pair of secondary windings of the first transformer and the one pair of opposing bridge terminals. The series resonant circuit is resonant at the second harmonic, whereby the intermodulation products that result from the mixing between the fundamental and second harmonic currents are reduced by reducing the magnitude of the second harmonic current.

Further scope of applicability of the present invention will become apparent from the detailed description provided hereinafter. It should be understood, however, that the detailed description and the specific example of the invention, while illustrating the preferred embodiment thereof, it is given by way of illustration only, since various changes and modifications coming within the spirit and scope of the invention will become apparent to those skilled in the art.

BRIEF DESCRIPTION OF THE DRAWINGS

The present invention will become more fully understood from the detailed description provided hereinbelow and the accompanying drawings, which are provided by way of illustration only, and thus are not meant to be interpreted in a limiting sense, and wherein.

DETAILED DESCRIPTION OF THE INVENTION

Figure 1:
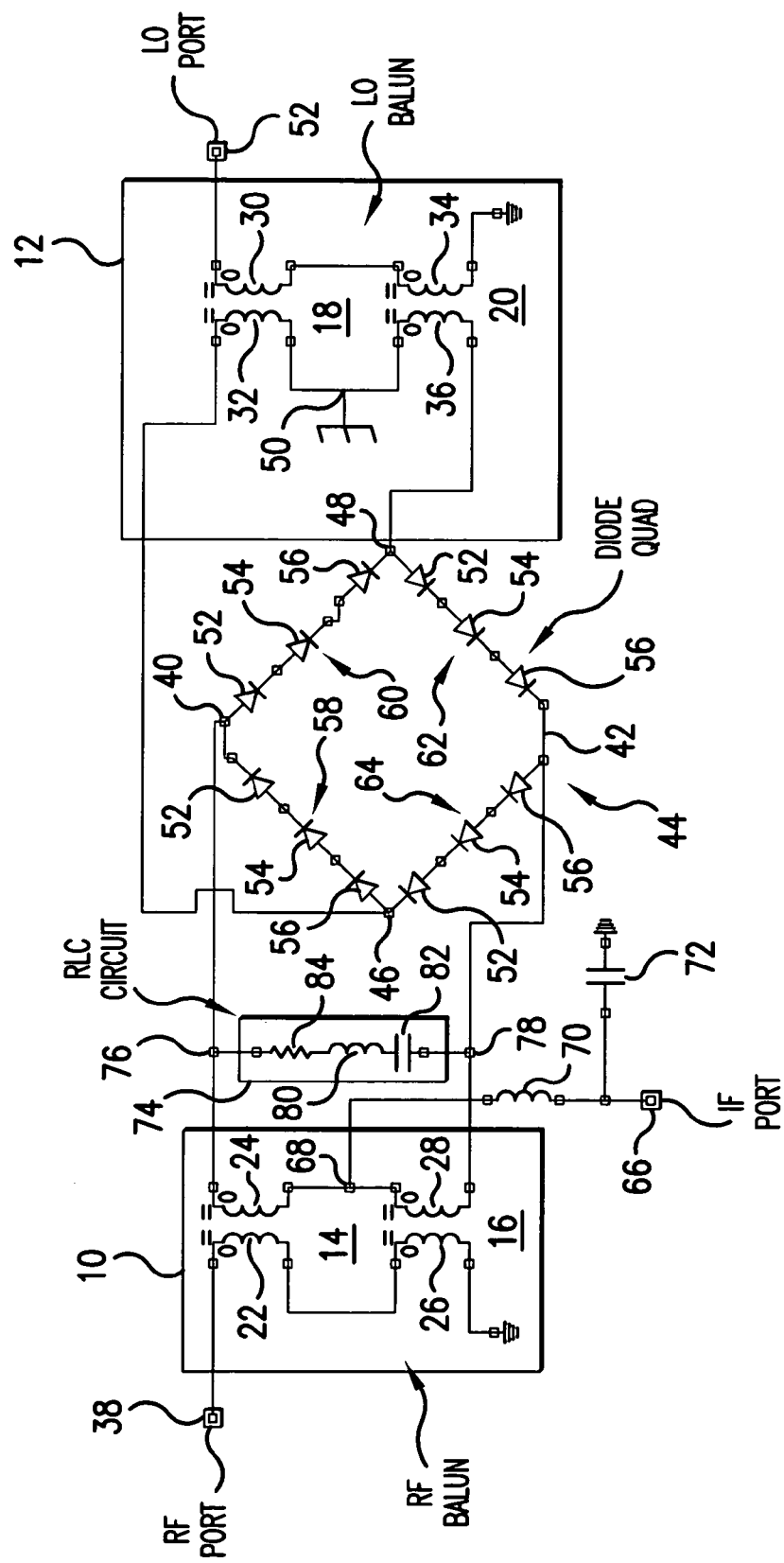
FIG. 1 is an electrical schematic diagram illustrative of the preferred embodiment of the invention.
Figure 2:
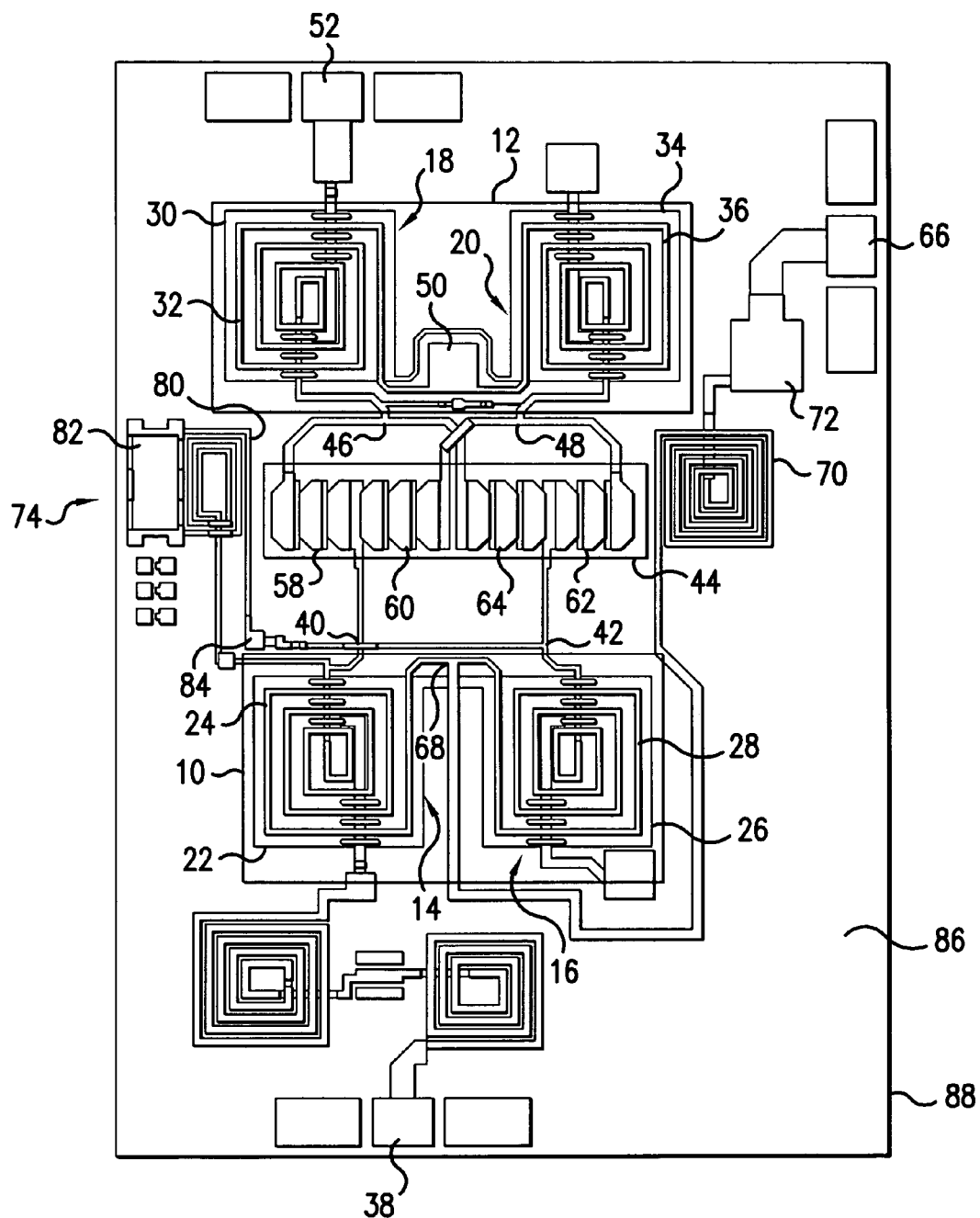
FIG. 2 is a plan view of the diode mixer shown in FIG. 1 implemented as a micro-miniature integrated circuit.

Referring now to the drawings wherein like reference numerals refer to like parts in FIGS. 1 and 2, reference numerals 10 and 12 denote balun type transformers which are well known to those skilled in the art for blocking common mode waves. The baluns 10 and 12 each consist of a pair of transformers 14, 16, and 18, 20. The two transformers 14 and 16 of the balun 10 are comprised of interwound spiral primary and secondary windings 22, 24 and 26, 28. Likewise, transformers 18 and 20 of the balun 12 include interwound positive and secondary windings 30, 32, and 34, 36. In both instances, respective secondary windings are connected in series as shown, namely, primary windings 22 and 26 are connected in series, the secondary windings 24 and 28 are connected in series, and the primary windings 30 and 34 are connected in series, and the secondary windings 34 and 36 are connected in series.

Further as shown, a radio frequency (RF) input port 38 is connected to one end of the primary winding 22 of balun 10, while one end of the primary winding 26 is connected to ground. The opposite ends of the series connected secondary windings 24 and 28 are connected to opposing bridge circuit terminals 40 and 42 of a diode "quad" bridge 44. The bridge 44 includes a second pair of opposing bridge circuit terminals 46 and 48 which are connected to opposite ends of the secondary windings 30 and 34 of the transformers 18 and 20 of the balun 12, which have their opposite ends connected to ground as shown by reference numeral 50. One end of the primary winding 30 of transformer 18, moreover, is connected to a local oscillator (LO) input port 52, while the opposite end of the series connected primary windings 30 and 34 is connected to ground. The diode quad bridge 44 consists of four sets of semiconductor diodes 52, 54, and 56 connected in four bridge arms 58, 60, 62 and 64.

Further, as shown in FIG. 1, an intermediate frequency (IF) output port 66 is coupled to a common connection point 68 of the secondary windings 24 and 28 of the transformers 14 and 16 in the RF balun transformer 10. An output coupling circuit consisting of a series connected inductor 70 and a capacitor 72 shunted to ground is used to couple an IF signal from the RF side of the mixer to the IF port 66. Also shown in FIG. 1 is a series resonant circuit 74 connected in parallel with the diode bridge 44 and the RF balun 10 at connection points 76 and 78 between the secondary windings 24 and 28 and the bridge circuit terminals 40 and 42. The series resonant circuit 74 is comprised of an inductor 80, a capacitor 82, and the fixed resistor 84. The purpose of the resonant circuit 74 is to terminate the second harmonic of the RF input signal generated in the diode quad bridge 44 so as to prevent it from mixing with the signal to produce intermodulation products of 2f2–f1 and 2f1–f2. The combination of the RF balun secondary transformer windings 24 and 28 and the resonant circuit 74 are resonant at the second harmonic of the RF input signal and thus operates to reduce the second harmonic current.

Referring now to FIG. 2, shown thereat is a layout of a micro-miniature integrated circuit (MMIC) implementation of the circuitry shown in FIG. 1 for L band operation in the region of 1.5–2 GHz. The same reference numerals used in FIG. 1 are applied to the corresponding components shown in FIG. 2. These circuit elements are fabricated on a surface 86 of a gallium arsenide (GaAs) substrate 88 having an area, for example, 1800×1400 microns and a thickness on the order of 100 microns. The semiconductor diodes in the implementation shown in FIG. 2 are HBT emitter-based junction diodes.

The interwound primary and secondary windings of the transformers 14 and 16 of the RF balun 10 and the interwound primary and secondary windings of the transformers 18 and 20 of the LO balun 12, are shown in FIG. 2 consisting of strips of metallization wound in rectangular spiral patterns located on the surface 86 of the substrate 88. As shown in FIG. 2, the resonant circuit 74 is located immediately adjacent the diode bridge 44 to increase the bandwidth.

It is well known that the output-third order intercept point (OIP) of a mixer provides a measure of its linearity. When two signals that are very close in frequency propagate through a mixer of high linearity, the inter-modulation product of 2f1–f2 and 2f2–f1, where f1 and f2 are the two signals that are close in frequency, get generated and are low in magnitude. The double balance mixer, as shown for example in FIGS. 1 and 2, have been found to achieve a relatively high output third order intercept point (OIP3). This feature is adapted to provide a receiver of a radar system, for example, a larger dynamic range and the ability to detect weaker targets.

The mixer as shown in FIGS. 1 and 2 is operable so as to achieve at OIP3 a minimum of 26 dBm to 30 dBm over a 1.5–2 GH band (L-band) with a local oscillator (LO) power of 27 dBm. This is achievable due to two features: the first is due to the use of three diodes 52, 54 and 56 in each of the arms 58, 60, 62 and 64 of the diode quad bridge. By doing so, the LO power needed to turn on the diodes is increased by 9.5 dB, in which case the OIP3 increases by the same amount. The second feature that improves the OIP3, is the placement of the series resonant circuit 24 in parallel with a diode quad bridge 44 at the RF side between the RF balun 10 and the diode quad bridge 44.

It should be noted that the concept of a resonant circuit as used in the subject invention can be used in any mixer at any frequency band to improve the third order intercept point of the mixer.

Figure 3:
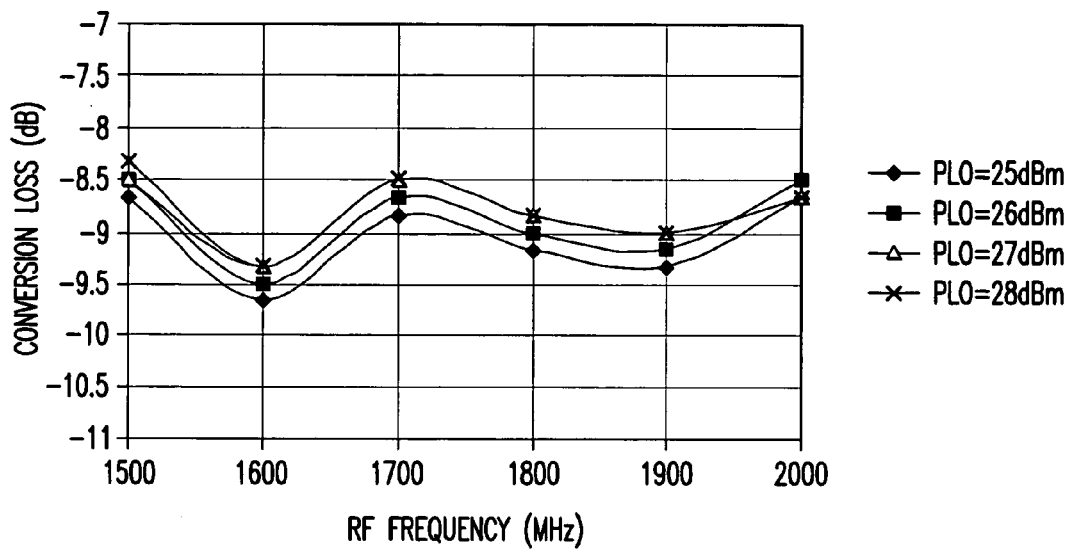
FIG. 3 is a set of curves illustrative of conversion loss vs. RF frequency characteristic of the mixer shown in FIG. 2.
Figure 4:
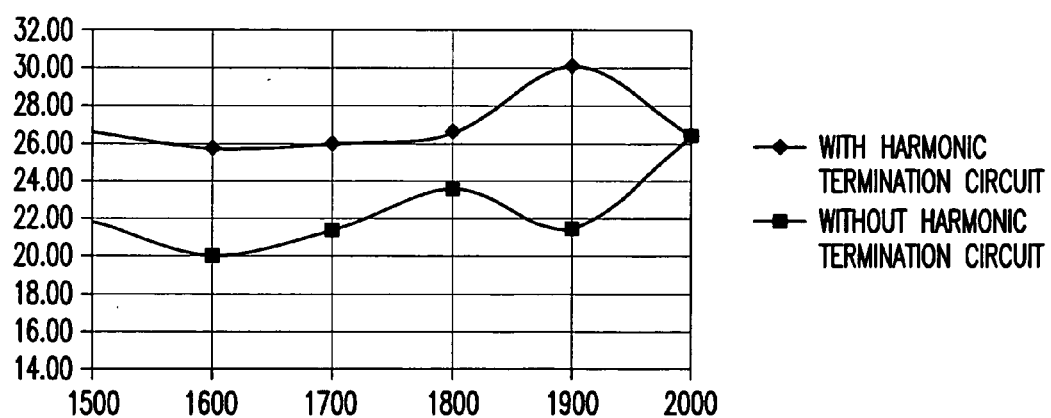
FIG. 4 is a set of characteristic curves illustrative of the output of the third order intercept point vs. RF frequency with and without a series RLC resonant circuit as shown in FIG. 1.

The characteristic curves shown in FIG. 3 are illustrative of the measured conversion loss of the mixer, while FIG. 3 illustrates the measured output third order intercept point of the mixer with and without the RLC circuitry 74 which proves that the harmonic termination improves the OIP 3 by more than 6 dB at various points of the band between 1500 and 2000 MHz (or 1.5–2.0 GHz).

The invention being thus described, it will be obvious that the same may be varied in many ways. Such variations are not meant to be regarded as a departure from the spirit and scope of the invention, and all such modifications as would be obvious to one skilled in the art are intended to be included within the scope of the following claims.

What is claimed is:

1. A double balanced signal mixer, comprising:
    a first and second balun type transformer, each having interwound pairs of series connected primary and secondary windings;
    a radio frequency (RF) input port connected to one end of the pair of primary windings of the first transformer and a ground connection connected to the other end of the pair of primary windings of said the first transformer;
    a local oscillator (LO) input port connected to one end of the primary windings of the second transformer and a ground connection connected to the other end of the pair of primary windings of the second transformer;
    an intermediate frequency (IF) output port connected via a signal coupling circuit to a center tap connection between the secondary windings of the first transformer;
    a ground connection connected to a center tap between the secondary windings of the second transformer;
    a diode quad in the form of a bridge circuit comprised of four circuit arms interconnected by opposing pairs of bridge terminals, each of said arms including a plurality of series connected diodes, one of said pair of opposing bridge terminals being connected across the secondary windings of the first transformer, and the other of said pair of opposing bridge terminals being connected across the pair of secondary windings of the second transformer; and
    means coupled at the RF side of the mixer between the bridge circuit and the first transformer for reducing intermodulation products and, thereby, improving the third order intercept point of the mixer.

2. The double balanced mixer according to claim 1 wherein said means comprises a resonant circuit commonly connected across said one pair of opposing bridge terminals of the bridge circuit and said pair of secondary windings of the first transformer.

3. The double balanced mixer according to claim 2 wherein the resonant circuit comprises an RLC series resonant circuit.

4. The double balanced mixer according to claim 3 wherein the resonant circuit is resonant at a second harmonic frequency of a signal applied to the RF input port.

5. The double balanced mixer according to claim 1 wherein said plurality of series connected diodes comprises at least three diodes.

6. The double balanced mixer according to claim 1 wherein the series connected diodes are comprised of HBT emitter-base junction diodes.

7. The double balanced mixer according to claim 1 wherein said signal coupling circuit comprises an LC circuit.

8. The double balanced mixer according to claim 7 wherein said LC comprises an inductor connected in series with the RF output port and a capacitor connected between the RF output port and ground.

9. The double balanced mixer according to claim 1 wherein the mixer is fabricated in a micro-miniature integrated circuit (MMIC).

10. The double balanced mixer according to claim 9 wherein said means for reducing intermodulation products comprises an RLC circuit fabricated immediately adjacent the bridge circuit.

11. The double balanced mixer according to claim 10 wherein the series connected diodes of said arms of the diode quad are all mutually aligned in a row and the RLC circuit is located at one end of said row of diodes.

12. The double balanced mixer according to claim 9 wherein the mixer is fabricated on a gallium arsenide substrate.

* * * * *